US006924655B2

(12) United States Patent
Kirby

(10) Patent No.: US 6,924,655 B2
(45) Date of Patent: Aug. 2, 2005

(54) PROBE CARD FOR USE WITH MICROELECTRONIC COMPONENTS, AND METHODS FOR MAKING SAME

(75) Inventor: Kyle K. Kirby, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/653,766

(22) Filed: Sep. 3, 2003

(65) Prior Publication Data

US 2005/0046431 A1 Mar. 3, 2005

(51) Int. Cl.$^7$ ................................................ G01R 31/02
(52) U.S. Cl. ................... 324/754; 324/158.1; 324/758; 29/830; 29/592.1; 29/593
(58) Field of Search ................................ 324/754, 758, 324/765, 158.1, 761, 760; 438/14, 17, 18; 257/48; 29/830, 592.1, 593, 825

(56) References Cited

U.S. PATENT DOCUMENTS

| | | |
|---|---|---|
| 4,721,198 A | 1/1988 | Yajima et al. |
| 5,020,219 A | 6/1991 | Leedy |
| 5,128,831 A | 7/1992 | Fox, III et al. |
| 5,172,050 A | 12/1992 | Swapp |
| 5,399,983 A | 3/1995 | Nagasawa |
| 5,422,574 A | 6/1995 | Kister |
| 5,444,386 A | 8/1995 | Mizumura |
| 5,521,522 A | 5/1996 | Abe et al. |
| 5,534,784 A | 7/1996 | Lum et al. |
| 5,550,482 A | 8/1996 | Sano |
| 5,593,927 A | 1/1997 | Farnworth et al. |
| 5,656,942 A | 8/1997 | Watts et al. |
| 5,739,050 A | 4/1998 | Farnworth |
| 5,815,000 A | 9/1998 | Farnworth et al. |
| 5,891,797 A | 4/1999 | Farrar |
| 5,894,218 A | 4/1999 | Farnworth et al. |

(Continued)

FOREIGN PATENT DOCUMENTS

WO    WO 97/04324 A1    2/1997

OTHER PUBLICATIONS

U.S. Appl. No. 10/682,703, filed Oct. 9, 2003, Kirby et al.
Form Factor, Inc., MicroSpring vs. MicroSpringsII Contact, p. 5, Southwest Test Workshop 2000, San Diego, CA, Jun. 12, 2000.

(Continued)

*Primary Examiner*—Michael Tokar
*Assistant Examiner*—Jimmy Nguyen
(74) *Attorney, Agent, or Firm*—Perkins Coie LLP

(57) ABSTRACT

The present disclosure provides probe cards which may be used for testing microelectronic components, including methods of making and using such probe cards. One exemplary implementation provides a probe card that employs a substrate with a plurality of openings. A first probe, which may be used to contact a microelectronic component, includes a first conductor slidably received in one of the openings and a first electrical trace. The electrical trace may be patterned from a metal layer on the back of the substrate and include a resilient free length adapted to urge the first conductor to extend outwardly beyond the front of the substrate. A second probe includes a second conductor slidably received in another one of the openings and a second electrical trace. The second electrical trace may be patterned from a metal layer on the front of the substrate and include a resilient free length adapted to urge the second conductor to extend outwardly beyond the back of the substrate. An electrical pathway through the substrate may electrically couple and first and second electrical traces.

53 Claims, 11 Drawing Sheets

U.S. PATENT DOCUMENTS

| | | | |
|---|---|---|---|
| 5,946,553 | A | 8/1999 | Wood et al. |
| 5,986,209 | A | 11/1999 | Tandy |
| 5,990,566 | A | 11/1999 | Farnworth et al. |
| 6,018,249 | A | 1/2000 | Akram et al. |
| 6,020,624 | A | 2/2000 | Wood et al. |
| 6,025,728 | A | 2/2000 | Hembree et al. |
| 6,048,744 | A | 4/2000 | Corisis et al. |
| 6,060,891 | A | 5/2000 | Hembree et al. |
| 6,072,190 | A | 6/2000 | Watanabe et al. |
| 6,072,233 | A | 6/2000 | Corisis et al. |
| 6,072,323 | A | 6/2000 | Hembree et al. |
| 6,081,429 | A | 6/2000 | Barrett |
| 6,089,920 | A | 7/2000 | Farnworth et al. |
| 6,094,058 | A | 7/2000 | Hembree et al. |
| 6,097,087 | A | 8/2000 | Farnworth et al. |
| 6,107,122 | A | 8/2000 | Wood et al. |
| 6,114,240 | A | 9/2000 | Akram et al. |
| 6,130,474 | A | 10/2000 | Corisis |
| 6,148,509 | A | 11/2000 | Schoenfeld et al. |
| 6,150,717 | A | 11/2000 | Wood et al. |
| 6,163,956 | A | 12/2000 | Corisis |
| 6,174,744 | B1 | 1/2001 | Watanabe et al. |
| 6,188,232 | B1 | 2/2001 | Akram et al. |
| 6,198,172 | B1 | 3/2001 | King et al. |
| 6,201,304 | B1 | 3/2001 | Moden |
| 6,208,156 | B1 | 3/2001 | Hembree |
| 6,214,716 | B1 | 4/2001 | Akram |
| 6,225,689 | B1 | 5/2001 | Moden et al. |
| 6,232,666 | B1 | 5/2001 | Corisis et al. |
| 6,239,489 | B1 | 5/2001 | Jiang |
| 6,247,629 | B1 | 6/2001 | Jacobson et al. |
| 6,255,833 | B1 | 7/2001 | Akram et al. |
| 6,258,623 | B1 | 7/2001 | Moden et al. |
| 6,259,261 | B1 | 7/2001 | Engelking et al. |
| 6,265,766 | B1 | 7/2001 | Moden |
| 6,281,042 | B1 | 8/2001 | Ahn et al. |
| 6,285,204 | B1 | 9/2001 | Farnworth |
| 6,294,837 | B1 | 9/2001 | Akram et al. |
| 6,294,839 | B1 | 9/2001 | Mess et al. |
| 6,326,698 | B1 | 12/2001 | Akram |
| 6,329,222 | B1 | 12/2001 | Corisis et al. |
| 6,331,221 | B1 | 12/2001 | Cobbley |
| 6,356,098 | B1 | 3/2002 | Akram et al. |
| 6,359,456 | B1 | 3/2002 | Hembree et al. |
| 6,373,273 | B2 | 4/2002 | Akram et al. |
| 6,397,460 | B1 | 6/2002 | Hembree |
| 6,437,586 | B1 | 8/2002 | Robinson |
| 6,480,012 | B1 | 11/2002 | Komori |
| 6,483,044 | B1 | 11/2002 | Ahmad |
| 6,518,779 | B1 | 2/2003 | Nakata et al. |
| 6,614,092 | B2 | 9/2003 | Eldridge et al. |
| 6,724,208 | B2 | 4/2004 | Matsunaga et al. |
| 6,727,115 | B2 | 4/2004 | Van Hoff |
| 6,747,465 | B2 * | 6/2004 | Esashi et al. ............... 324/754 |
| 6,762,612 | B2 * | 7/2004 | Yu et al. ..................... 324/757 |
| 6,781,392 | B1 * | 8/2004 | Cheng et al. ............... 324/754 |
| 2002/0163349 | A1 | 11/2002 | Wada et al. |

OTHER PUBLICATIONS

Cascade Microtech, Inc., Production Probe Cards, 1 page, <http://www.cascademicrotech.com/index.cfm/fuseaction/pg.view/plD/10>, May 1, 2003.

Cascade Microtech, Inc., Advantages of Pyramid Probe Cards, 2 pages, <http://www.cmicro.com//index.cfm/fuseaction/pg.view/plD/297>, May 1, 2003.

Cascade Microtech, Inc., Pyramid Probe Technology, 1 page, <http://cmicro.com/index.cfm/fuseaction/pg.view/plD/309>, May 1, 2003.

Cascade Microtech, Inc., Pyramid Probe Cards, 2 pages, <http://www.cmicro.com/index.cfm/fuseaction/pg.view/plD/299>, May 1, 2003.

GGB Industries, Inc., Picoprobe Probe Cards, 6 pages, <http://www.ggb.com/probecrd.html>, May 1, 2003.

* cited by examiner

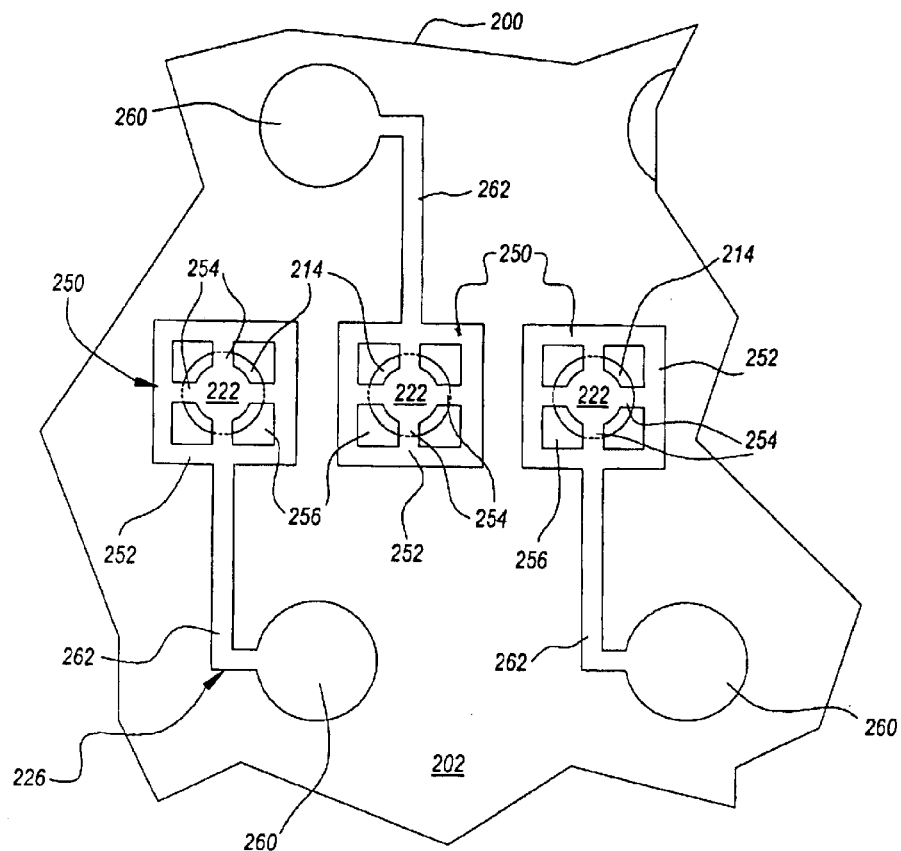
*Fig. 9A*
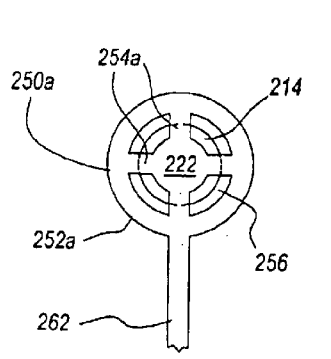
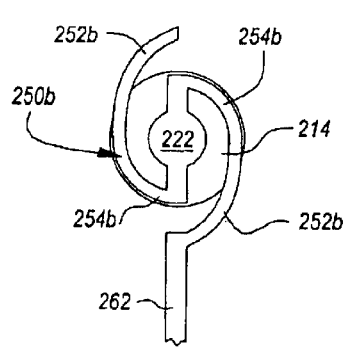
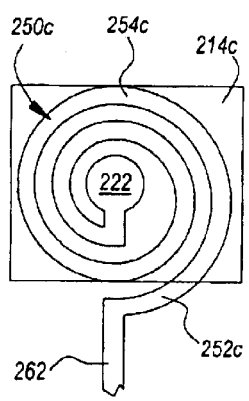
*Fig. 9B*  *Fig. 9C*  *Fig. 9D*

PROBE CARD FOR USE WITH MICROELECTRONIC COMPONENTS, AND METHODS FOR MAKING SAME

BACKGROUND

The present invention provides certain improvements in microelectronic component testing. More particularly, the present invention provides probe cards of the type that may be used in testing microelectronic components. These probe cards are not limited to microelectronic component testing, though, and have utility in a variety of other applications, as well.

The microelectronics industry is highly competitive and most microelectronics manufacturers are highly sensitive to quality and cost considerations. Most microelectronics manufacturers require that suppliers of microelectronic components test the performance of each microelectronic component before shipment to minimize the manufacturer's product losses. Microelectronics are commonly tested by establishing temporary electrical connections between a test system and electrical contacts on the microelectronic component.

One way of establishing a temporary electrical connection between the test system and the contacts on the microelectronic component employs a probe card carrying a plurality of probe pins. The probe pins are typically either a length of wire or a relatively complex spring-urged mechanism, e.g., POGO PINS, commercially available from Pogo Industries of Kansas City, Kans., USA. The probe pins are individually formed then inserted in a pin mounting plate in which an array of holes has been precisely machined. This is a fairly laborious, expensive process. The process becomes even more complex as microelectronic components move to progressively finer contact pitches, which require the probe pins to be spaced closer and closer to one another.

BRIEF DESCRIPTION OF THE DRAWINGS

FIGS. 4–12 schematically illustrate sequential stages in a process of manufacturing a microelectronic probe card in accordance with the method of FIG. 3.

DETAILED DESCRIPTION

A. Overview

Figure 1:
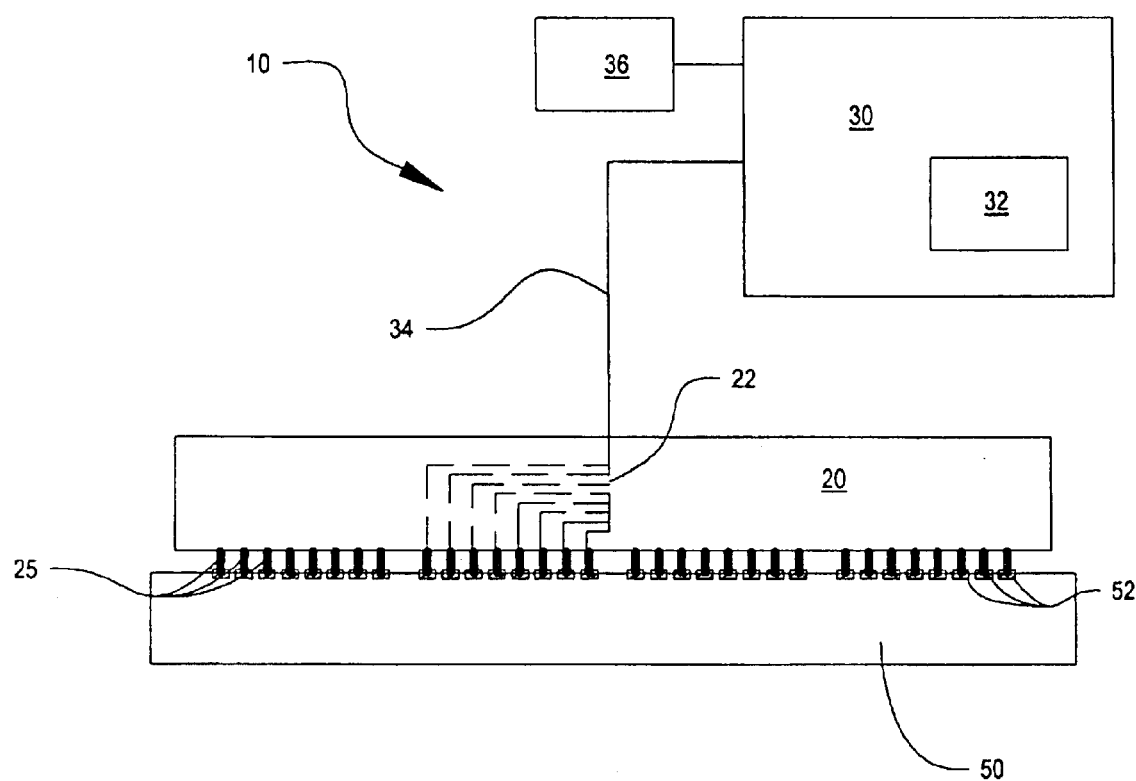
FIG. 1 is a schematic overview of a microelectronic component test system in accordance with an embodiment of the invention.

Various embodiments of the present invention provide probe cards useful in testing microelectronic components and methods for manufacturing such probe cards. The terms "microelectronic component" and "microelectronic component assembly" may encompass a variety of articles of manufacture, including one or more memory modules (e.g., SIMM, DIMM, DRAM, flash-memory), ASICs, processors, semiconductor wafers, semiconductor dies singulated from such wafers, or any of a variety of other types of microelectronic devices or components therefor. The term "probe card" may encompass a variety of architectures, including both rigid structures and flexible structures, and including probe assemblies adapted for testing single microelectronic components and those adapted for testing multiple devices simultaneously, e.g., wafer-level testing. If so desired, the array of pins may be electrically coupled to contacts carried on a backing member that is joined to the substrate.

In one implementation, the invention provides a probe card of the type used for microelectronic component testing that includes a substrate, first and second conductors, and first and second electrically conductive urging members. The substrate has a first surface, a second surface, and a plurality of openings extending from the first surface to the second surface in an array. The first conductor has a proximal portion adjacent to the second surface of the substrate, and intermediate length slidably received in a first of the openings, and a distal portion extending beyond the first surface of the substrate. The second conductor has a proximal portion adjacent to the second surface of the substrate, an intermediate length slidably received in a second of the openings, and a distal portion extending beyond the first surface of the substrate. The urging members are carried by the second surface of the substrate, with the first urging member being attached and electrically coupled to the proximal portion of the first conductor and urging the first conductor toward the first surface, and with the second urging member being attached and electrically coupled to the proximal portion of the second conductor and urging the second conductor toward the first surface.

In accordance with another embodiment to the invention, such a probe card may be included in a microelectronic component testing system. This microelectronic component testing system may also include a power supply and a controller. The controller may be coupled to the first and second urging members and to the power supply. The controller may be adapted to selectively control delivery of power from the power supply to the first and second conductors.

A probe card in accordance with another embodiment of the invention includes a substrate, a first probe adapted to temporarily electrically contact a microelectronic component for testing, a second probe that may be adapted to contact a test head of a test system, for example, and an electrical pathway. The substrate has a first surface, a back surface, and a plurality of openings extending from the first surface to the back surface. The first probe includes a first conductor and first electrical trace. The first conductor is slidably received in one of the openings through the substrate. The first electrical trace may have a resilient free length adapted to urge the first conductor toward a default position wherein a distal portion of the first conductor extends outwardly beyond the front surface of the substrate by a first distance. The second probe includes a second electrical trace and a second electrical conductor that is slidably received in another one of the openings through the substrate. The second electrical trace may be patterned from a metal layer on the front surface of the substrate and have a resilient free length adapted to urge the second conductor toward a default position wherein a distal portion of the second conductor extends outwardly beyond the back surface of the substrate by a second distance. In one implementation, the first distance is greater than a thickness of the second electrical trace and the second distance is greater than a thickness of the first electrical trace. The electrical pathway extends through the substrate to electrically couple the first electrical trace to the second electrical trace.

A method of manufacturing a probe card in accordance with another embodiment of the invention includes depositing an intermediate layer on an inner surface of an opening through a substrate, with the opening extending from a front surface to a back surface of the substrate. The resultant lined opening may be substantially filled with an electrically conductive material (e.g., a metal) and an overburden of the electrically conductive material may be deposited on the back surface of the substrate. The electrically conductive material in the opening defines a conductor. A front thickness of the substrate adjacent the front surface may be removed, exposing a distal portion of the conductor. The overburden may be patterned to define an electrically conductive urging member attached and electrically coupled to the conductor. The urging member may urge the conductor toward a position wherein the distal portion of the conductor is exposed.

Another embodiment of the invention provides a method of testing a microelectronic component. In accordance with this method, a microelectronic component is positioned in a test area. A confronting surface of the microelectronic component may be juxtaposed with a front surface of a probe card, with a first probe of the probe card juxtaposed with a first component contact of the microelectronic component and a second probe carried by the probe card juxtaposed with a second component contact of the microelectronic component. The first probe comprises a first conductor slidably received in a first opening in the substrate and an electrically conductive first trace carried by a back surface of the probe card. The second probe may comprise a second conductor slidably received in a second opening in the substrate and an electrically conductive second trace carried by a back surface of the probe card. The first component contact may be contacted with the first conductor and the second component contact may be contacted with the second conductor. A distance between the confronting surface of the microelectronic component and the front surface of the probe card may be reduced. The first component contact may force the first conductor to slide in the first opening in a direction toward the back surface of the substrate and to deform the first trace, with the first trace urging the first conductor toward the first component contact. The second component contact may force the second conductor to slide in the second opening in a direction toward the back surface of the substrate and to deform the second trace, with the second trace urging the second conductor toward the second component contact. A test signal may be delivered to the microelectronic component, with the test signal being carried by the first trace to the first conductor and by the first conductor to the first component contact.

For ease of understanding, the following discussion is broken down into three areas of emphasis. The first section explains the context of a test system in which probe cards may be employed. The second section outlines methods of manufacturing probe cards according to several embodiments of the invention. The third section discusses testing microelectronic components in accordance with other embodiments of the invention.

B. Test Systems

FIG. 1 schematically illustrates one embodiment of a microelectronic component test system 10 that may be used to test a microelectronic component 50. The microelectronic component test system 10 includes a probe card 20 that is connected to a controller 30. The probe card 20 includes a plurality of probes 25 that may be positioned to contact electrical contacts 52 on the microelectronic component 50. The probes 25 may be connected to circuitry (schematically illustrated in dashed lines 22) in communication with each of the probes and adapted to deliver and/or receive test power (including test signals) to one or more of the probes 25.

The controller 30 may communicate with the circuitry 22 of the probe card 20 by a communication line 34. The controller 30 may take any of a variety of forms. In one embodiment, the controller 30 comprises a computer having a programmable processor 32. The controller 30 may be operatively coupled to a power supply 36 and selectively control delivery of power from the power supply 36 to the probes 25 of the probe card 20 via communication line 34. In one embodiment, a single power supply 36 is used to deliver test power to the probes 25. It should be understood, though, that two or more separate power supplies might be used.

Figure 2:
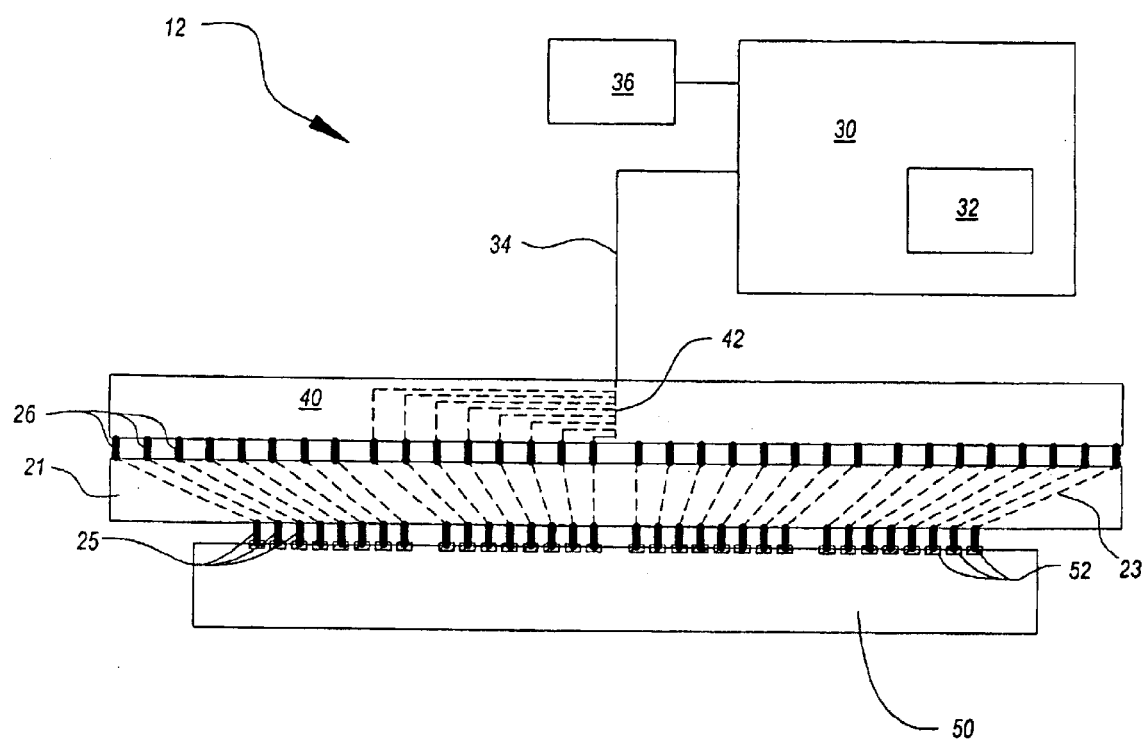
FIG. 2 is a schematic overview of a microelectronic component test system in accordance with another embodiment of the invention.

FIG. 2 schematically illustrates a microelectronic component test system 12 in accordance with another embodiment of the invention. Many aspects of this microelectronic component test system 12 are similar to aspects of the microelectronic component test system 10 of FIG. 1 and like reference numbers are used in FIGS. 1 and 2 to indicate like elements. The microelectronic component test system 12 of FIG. 2 includes a probe card 21 and a test head 40. The probe card 21 carries a plurality of component probes 25 adjacent one surface of the probe card 21 and a plurality of head probes 26 carried on the opposite side of the probe card 21. The component probes 25 may be positioned to contact the electrical contacts 52 of the microelectronic component 50. The head probes 26 may be positioned to contact electrical contacts (not shown) on the test head 40. The pitch of the contacts on the test head 40 may be larger than the pitch of the contacts 52 on the microelectronic component 50. Some or all of the component probes 25 may be electrically connected to one or more of the head probes 26 by circuitry 23 (shown schematically) in the probe card 21. The test head 40 may include circuitry 42 (also shown schematically) that provides a communication path between the head probes 26 and the controller 30.

As explained more fully below, some embodiments of the invention provide methods for manufacturing probe cards that include arrays of conductors arranged in an array that corresponds to an array of electrical contacts 52 carried by the microelectronic component 50. It should be understood that the probe cards made in accordance with the methods outlined below may, but need not, be used in a test system 10 such as that illustrated in FIG. 1 or a test system 12 such as that illustrated in FIG. 2. In particular, the probe cards made in accordance with the present invention may be suitable for other applications where temporary, compliant electrical contact is desired.

C. Probe Cards

Figure 3:
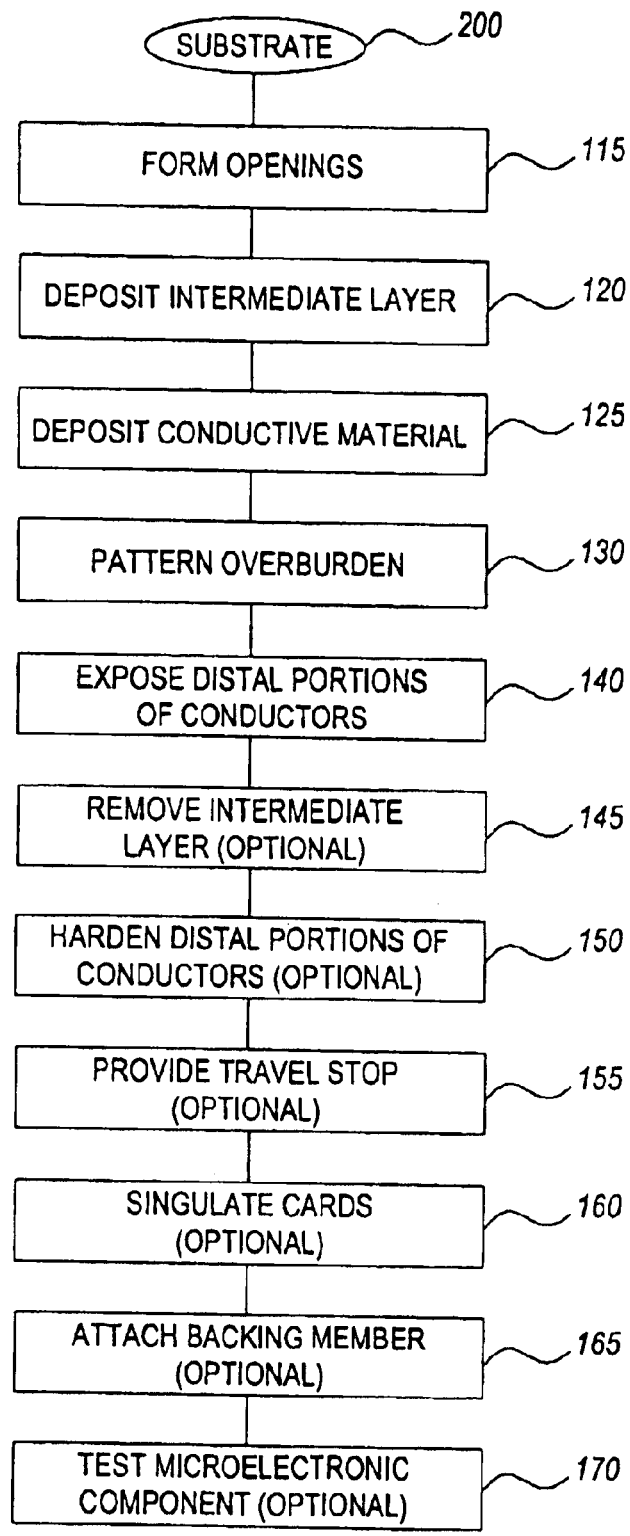
FIG. 3 is a flowchart schematically illustrating a method in accordance with a further embodiment of the invention.
Figure 4:
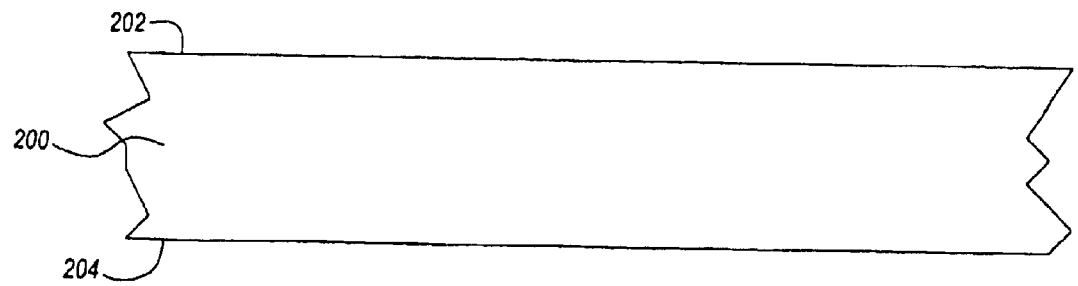
Figure 5:
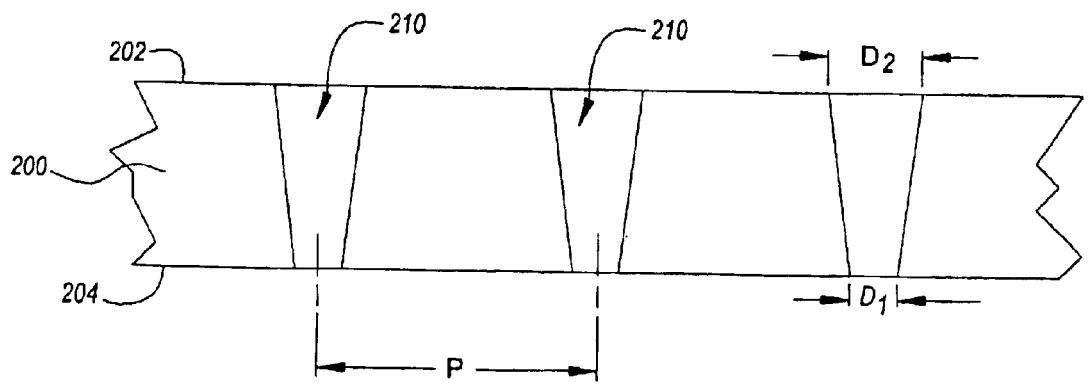

FIG. 3 schematically illustrates one embodiment of a method of manufacturing microelectronic component probe cards. FIGS. 4–12 are schematic cross-sectional views of the device as it is manufactured. The method 100 of FIG. 3 starts by providing a substrate 200. As shown in FIG. 4, the substrate 200 generally includes a back face 202 and a front face 204. In one embodiment, the back and front faces 202 and 204 are generally parallel to one another, yielding a planar substrate 200. The substrate 200 may comprise a relatively rigid material that is able to resist buckling, stretching, or other deformation during the manufacturing processes outlined below. Suitable materials for the substrate 200 include ceramic, silicon (e.g., an undoped silicon wafer), glass, glass-filled resins, photosensitive glass, or plastic materials, e.g., plastic composites used in printed circuit boards such as FR-4 PCBs.

In procedure 115, vias or openings 210 are formed through the thickness of the substrate from the back face 202 to the front face 204 of the substrate 200. The openings 210 may be arranged in an array that corresponds to an array of contacts on a particular microelectronic component design to be tested with the probe card.

The openings 210 may be formed in a variety of different fashions, with the optimal method depending, at least in part, on the nature of the substrate 200. The forming process should permit forming the array of openings 210 with the requisite pitch P. For example, some ceramic, silicon, and photosensitive glass substrates can be patterned using a photolithographic process and etched with a wet etchant or the like to form the openings 210. Photosensitive glass materials are commercially available from Schott Corporation of Yonkers, N.Y., USA under the trade name FOTURAN. Depending on the nature of the substrate material and the necessary tolerances for any given application, the openings 210 can instead be molded integrally with the substrate rather than being formed in the separate process in procedure 115.

In some embodiments of the invention, the openings 210 are laser machined through the substrate 200. The openings 210 shown on FIG. 5 taper outwardly from a first diameter $D_1$ adjacent the front surface 204 outwardly to a larger second diameter $D_2$ adjacent the back surface 202 of the substrate 200. Such a tapered opening may be formed with a relatively high degree of precision with a laser machining apparatus of the type commercially available from a variety of sources, e.g., General Scanning of Somerville, Mass., USA, or Synovea S.A. of Lausanne, Switzerland. As is known in the art and discussed in some detail in U.S. Pat. No. 6,114,240, the entirety of which is incorporated herein by reference, the rate of tapering and the diameters $D_1$ and $D_2$ of the openings 210 may be selected by controlling the focal length and focal plane of the laser beam. If so desired, openings 210 having a substantially constant diameter (or other lateral dimension for non-circular openings) such as those shown in the substrate 200 of FIG. 13 can be laser machined through the substrate 200, though they may also be formed by "dry" etching.

The diameters $D_1$ and $D_2$ and pitch P of the openings 210 may be varied to meet the needs of any specific application, but the larger diameter $D_2$ may be limited, at least in part, by the pitch P of the openings 210. Generally, openings 210 having larger diameters will yield conductors (discussed below) having a lower resistance, which can improve performance of the test system 10. A sufficient distance should be left between each of the openings 210 to reduce any electrical cross talk or capacitance issues in the final probe card. In one embodiment, the smaller front diameter $D_1$ of each of the openings 210 is at least 10 µm. A front diameter $D_1$ of about 10–50 µm is expected to suffice for most fine-pitch testing applications. For applications with larger pitch P, the front diameter $D_1$ may be 50 µm or greater. A front diameter $D_1$ of about 50–200 µm is considered adequate for most larger-pitch applications. The relative dimensions of the lower diameter $D_1$ and back diameter $D_2$ may be varied as desired. In one embodiment, the upper diameter $D_2$ is at least as great as the front diameter $D_1$. In one suitable embodiment, the back diameter $D_2$ may be about 1–2 times the front diameter $D_1$. For example, the back diameter $D_2$ may be about 30 µm and the front diameter $D_1$ may be about 17 µm.

Figure 6:
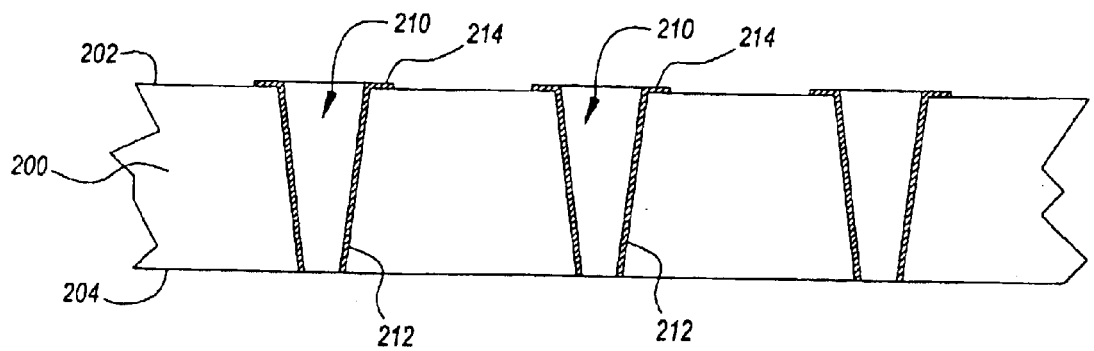

Turning back to FIG. 3, after the openings 210 are formed in procedure 115, an intermediate layer may be deposited on the substrate 200 in procedure 120. FIG. 6 schematically illustrates the substrate 200 with an intermediate layer 212 deposited thereon. In particular, the intermediate layer 212 may substantially cover an internal surface of each of the openings 210 and may also cover the front face 202 of the substrate. In the illustrated embodiment, the intermediate layer 212 has been patterned to selectively expose portions of the back face 202. A peripheral rim 214 of the intermediate layer 212 has been left about the periphery of each opening 210. The same structure can also be achieved by applying the intermediate layer 212 using a stencil.

Materials useful as the intermediate layer 212 will depend, at least in part, on the nature of the substrate 200 and the nature of the conductive material used in subsequent procedures to fill the openings 210. As explained below, the intermediate layer 212 may either remain in place in the final probe card 300 or may be selectively removed, leaving a space where the intermediate layer 212 used to be. If the intermediate layer 212 is intended to remain in place in the final probe card 300, it may limit adhesion between the substrate 200 and the conductor (222 in FIG. 7) deposited in the opening 210. In one embodiment, such an intermediate layer 212 may comprise a dielectric material having greater adhesion to the substrate 200 than to the conductor received in the opening 210. This will permit the conductor 222 to slide axially within the opening 210 during operation, as explained below in connection with FIG. 14. Suitable materials for such an intermediate layer 212 may include polyamides (e.g., polytetrafluoroethylene) and parylene, which is a highly conformal coating commercially available from a number of suppliers, including Advanced Coating of Rancho Cucamonga, Calif., USA.

As noted above, the intermediate layer 212 is removed in some embodiments of the invention. To facilitate its removal, the intermediate layer 212 may be formed of a material that can be selectively removed while limiting removal of the substrate 200 and the conductor (222 in FIG. 7) received in the opening 210. As explained below, the intermediate layer 212 can be removed by etching with an etchant fluid that etches the material of the intermediate layer 212 faster than it attacks the substrate 200 or the material of the conductor. For example, the intermediate layer 212 may be formed of an oxide, such as a relatively low-quality thermally enhanced silicon oxide (TEOS), which may be formed by oxidizing a silicon substrate 200. As is known in the art, such oxides can be selectively etched, leaving silicon and metals largely intact using a solution with an appropriate pH. For example, an etchant to selectively remove an oxide intermediate layer 212 may comprise glycol, ammonium fluoride, deionized water, and hydrofluoric acid, with the relative proportions of these components controlled to achieve a pH that is appropriate for the particular oxide selected for the intermediate layer 212.

In one embodiment, the intermediate layer 212 provides a measure of electrical insulation between the conductive material later filled in the openings 210. This can be useful if the substrate 200 comprises a semiconductor, for example, but likely will be unnecessary if the substrate 200 is formed of an electrically insulative material. The intermediate layer 212 may also serve as a chemical barrier to limit interaction of the material filling the openings 210 with the material of the substrate 200.

Figure 7:
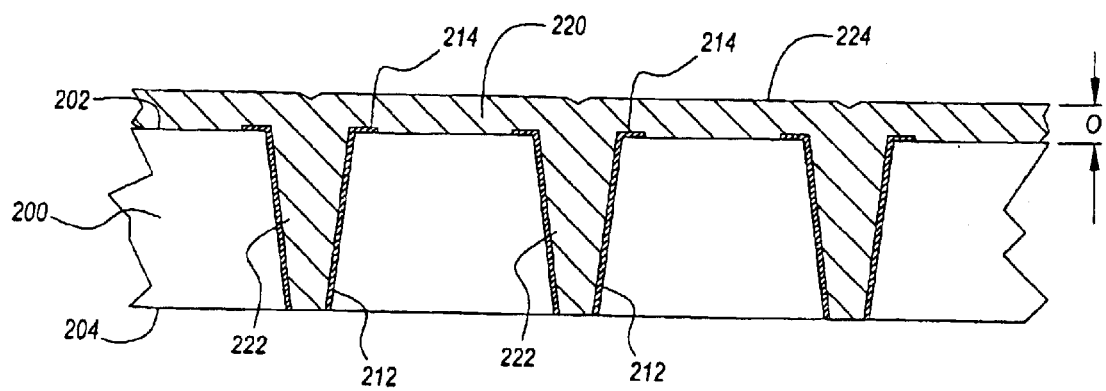

The next procedure 125 in the method 100 outlined in FIG. 3 comprises depositing a conductive metal or other suitable conductive material. As shown in FIG. 7, the conductive metal 220 may substantially fill each of the openings 210, defining a conductor 222 in each of the openings 210. An excess of the conductive metal 220 may be deposited on the exterior of the intermediate layer 212 and the back face 202 of the substrate 200. This excess conductive metal 220 may define an overburden O which extends across the back face 202 of the substrate 200 and electrically connects each of the conductors 222 to one another.

Any suitably conductive material may be used, including a conductive polymer or a suitably conductive polysilicon. In some embodiments, the conductive material 220 desirably comprises a conductive metal, e.g., aluminum, copper, nickel, gold, beryllium-copper, or alloys of aluminum, copper, nickel, gold, or beryllium. The conductive metal 220 may be applied in a variety of conventional processes, including CVD, PVD, and electrochemical deposition, e.g., electroless deposition and/or electrolytic deposition.

In one particular embodiment, the conductive metal 220 may be electrochemically deposited by first depositing the overburden O and, if desired, patterning the overburden O (procedure 130, discussed below) without filling the openings 210. The overburden O may be deposited in any suitable fashion, e.g., by electrochemical deposition, CVD, or PVD. After the overburden O is deposited, the openings may be formed through the substrate 200, e.g., by laser ablation from the front face 204 toward the back face 202. In one implementation, the opening 210 will extend entirely through the substrate 200 and the overburden O. Advantageously, though, the opening 210 will terminate proximate the back face 202, leaving a portion of the overburden to cover the back of the opening 210. The front face 204 and the interior of the opening 210 may be exposed to a suitable electrochemical solution, e.g., an electroplating bath, and the overburden O (or patterned overburden 226, discussed below) may be electrically coupled to a power source. Creating an electrical potential between the overburden O and an electrode in contact with the electrochemical solution will deposit a conductive material in the openings 210. In one embodiment, the process will continue until the conductive material extends outwardly beyond the front face 204 and the excess conductive material is removed, e.g., by conventional mechanical planarization or chemical-mechanical planarization processes (collectively referred to as "CMP" processes). Such a deposition process is disclosed in co-owned U.S. patent application Ser. No. 10/682,703, filed Oct. 9, 2003, under the title "Methods of Plating Via Interconnects".

The overburden O of conductive metal 220 electrically connects each of the conductors 222 to one another. This would interfere with effective operation of the test system 10 shown in FIG. 1. Consequently, the method 100 includes a procedure 130 of isolating the conductors 222. The conductors 222 may be isolated in a variety of different fashions. In one embodiment, the thickness of the overburden O is thinned to a reduced thickness (T in FIG. 8), e.g., by polishing the exterior 224 of the conductive metal 220. Although optional, thinning the overburden O to a consistent thickness T may improve uniformity across the probe card and from one probe card to another. The overburden O may be thinned using CMP processes, which are well known in the art and need not be detailed here. Briefly, though, CMP processes may involve abrading the exterior surface 224 of the metal layer 220 using an abrasive medium. A planarizing pad may carry the abrasive medium and the substrate 200 may be urged toward the planarizing pad with a controlled force until the desired thickness of material has been removed.

After the overburden thinning, if performed, the conductors 222 may be electrically isolated by patterning the overburden O. As suggested in FIG. 8, patterning the overburden O may comprise removing a portion of the overburden O to expose a portion of the back surface 202 of the substrate and leave a patterned overburden 226. This patterning may be accomplished using conventional techniques, e.g., coating with a photoresist, exposing to radiation, selective etching, then removing remaining photoresist. In one embodiment, the connectors 222 are electrically isolated from one another by forming electrically separate islands, each of which is localized adjacent its associated conductor 222. In an alternative embodiment, the patterned overburden 226 defines electrical circuitry on the back surface 202 of the substrate 200. As shown in FIG. 9A, the patterned overburden 226 may function as an integrated redistribution layer, providing a plurality of new contact pads 260 for electrically coupling the connectors 222 to a backing member or the like (as noted below). These contact pads 260 may have a greater pitch than the conductors 222, i.e., they may be spaced farther from one another than are the conductors 222.

Figure 8:
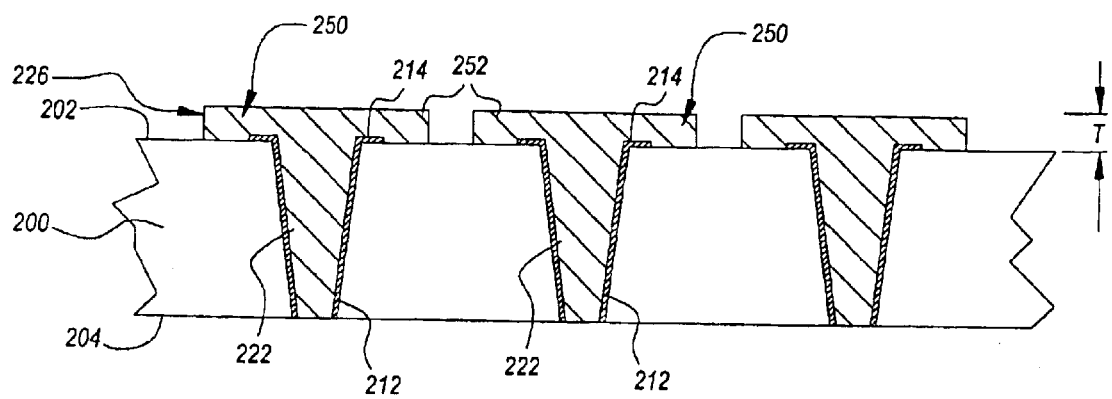

As schematically shown in FIGS. 8 and 9A, the patterned overburden 226 may define a series of conductive electrical traces, each of which includes a urging member 252 and a contact pad 260 connected to the urging member 252 by a lead line 262. Each of the urging members 252 is attached and electrically coupled to one of the conductors 222, with the urging member 252 and associated conductor 222 together defining a probe 250. In the particular embodiment shown in FIG. 9A, the urging member 252 is generally rectangular in shape and has a series of openings 256 therethrough that define resilient arms 254. At least a portion of each of the arms 254 may overlie the peripheral rim 214 of the intermediate layer 212. As explained below in connection with FIG. 17, though, at least the portions of the arms 254 overlying the peripheral rim 214 of the intermediate layer 212 are designed to flex in response to pressure exerted on the conductor 222 during use. In this fashion, the urging member 252 serves a spring-like function, urging the conductor 222 against the contact 52 of a microelectronic component 50 (FIG. 17), for example.

FIG. 9B is a schematic top view of a probe 250a in accordance with another embodiment of the invention. This probe 250a includes a urging member 252a and a series of flexible arms 254a that at least partially overlie the peripheral rim 214 of the intermediate layer 212. Whereas the urging member 252 of FIG. 9A is generally rectangular in shape, the urging member 252a of FIG. 9B is generally circular in shape and has a series of arcuate openings 256 that define the arms 254a.

FIG. 9C illustrates a probe 250b in accordance with another embodiment of the invention. The urging member 252b of this probe 250b includes a pair of resilient, arcuate arms 254b that are attached to the probe 222 at diametrically opposite positions. An elongate length of each of the arcuate arms 254b overlies the peripheral rim 214 of the intermediate layer. When a microelectronic component 50 presses against the distal end of the conductor 222, as is discussed in connection with FIG. 17, the arcuate arms 254b will flex in a fashion that will tend to cause the probe 222 to twist about its axis. Such twisting provides a scrubbing motion of the probe 222 against the microelectronic component contact 52 (FIG. 17), facilitating penetration of the probe through any overlying oxide layer and into the contact 52.

Figure 17:
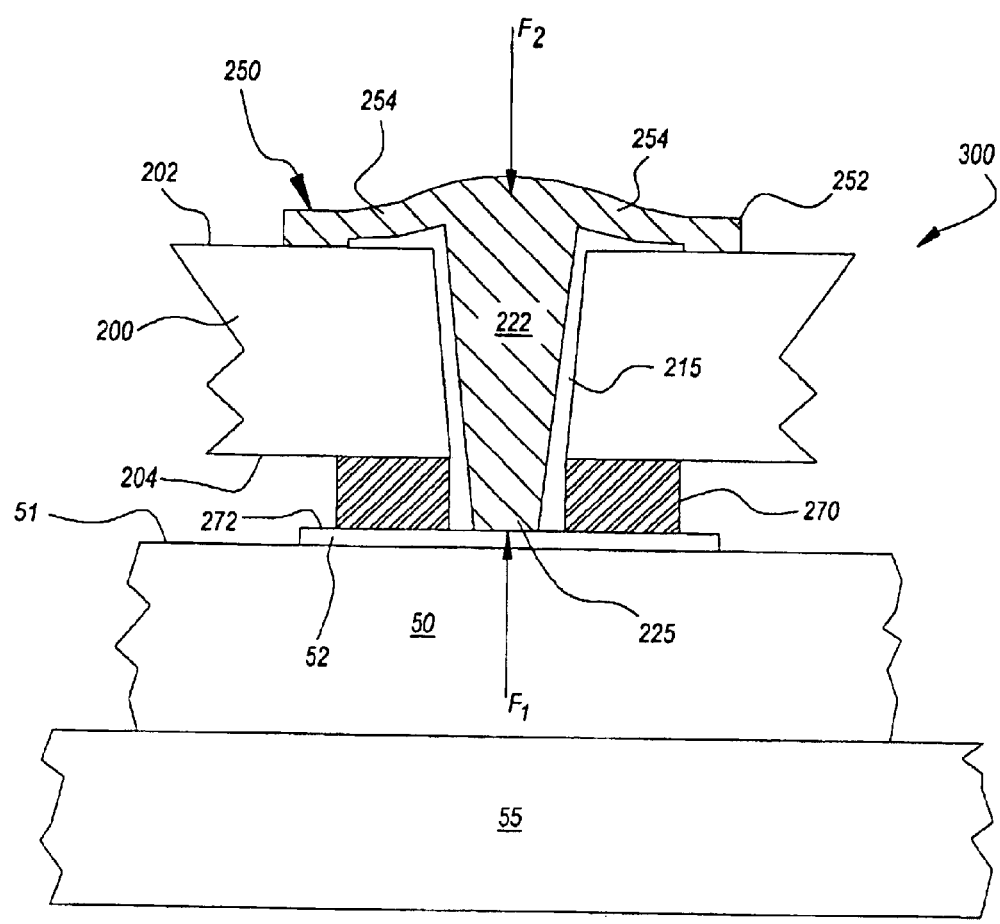
FIG. 17 is a schematic cross-sectional view depicting the probe card of FIG. 12 in use in accordance with a further embodiment of the invention.

FIG. 9D illustrates a probe 250c in accordance with yet another embodiment of the invention. The urging member 252c of this probe 250c includes an arm 254c having a spiral length that overlies the peripheral rim 214c of the intermediate layer. If so desired, this peripheral rim 214c may be rectangular, as shown, or, generally circular, as shown in FIGS. 9A–C. It is anticipated that such a spiral arm 254c may also induce some degree of scrubbing action against a microelectronic component contact 52 (FIG. 17).

Figure 10:
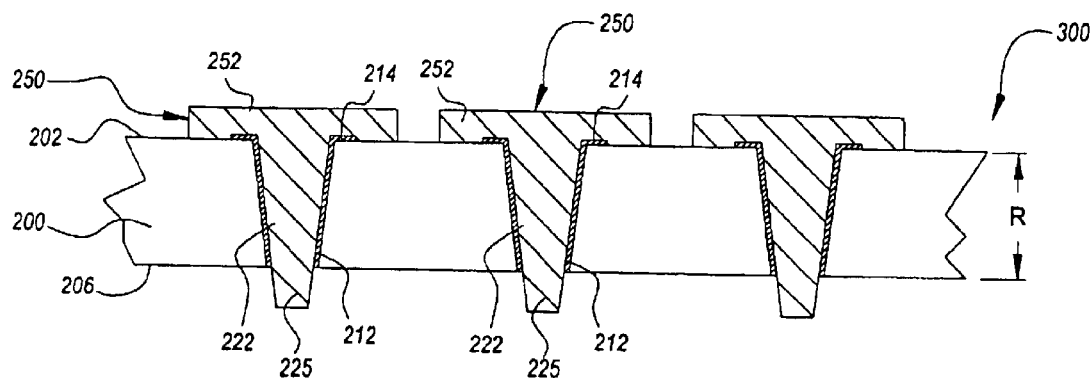

The next procedure 140 of the method 100 removes a portion of the substrate 200 to expose a distal portion of each of the conductors 222. This may be accomplished in a variety of ways. If so desired, the front surface 204 of the substrate may first be planarized using conventional CMP techniques to ensure that the tips of the conductors 222 are substantially coplanar. FIG. 10 schematically illustrates the probe card 300 which results from selectively removing a front portion of the substrate 200 in procedure 140. At this stage, the thickness of the substrate 200 has been reduced so that only a remaining thickness R of the substrate 200 remains. An exposed distal portion 225 of each of the conductors 222 extends outwardly beyond the etched face 206 of the substrate 200. The exposed distal portion 225 of each of the conductors 222 has a surface 224 that is adapted to establish temporary electrical contact with a contact (52 in FIG. 1) on a microelectronic component (50 in FIG. 1).

The thickness of the substrate 200 may be reduced in a variety of manners. In one embodiment, the substrate 200 is etched with a chemical etchant that selectively attacks the substrate 200, leaving the conductor 222 exposed. If the substrate 200 is formed of silicon, for example, a wide variety of commercially available chemical etchants (e.g., a mixture of TMAH and propylene glycol) can be used to etch the silicon substrate 200 without materially affecting a connector 222 formed of a metal, for example. In another embodiment, the substrate 200 may be a multi-layer substrate. In particular, the remaining thickness R of the substrate 200 may comprise a first material while the front portion to be removed from the substrate 200 is formed of another material. For example, the remaining thickness R of the substrate 200 may be formed of a ceramic, silicon, or glass and the front portion of the substrate to be removed in procedure 140 (FIG. 3) is formed of a photoresist or other readily-dissolved material.

Figure 11:
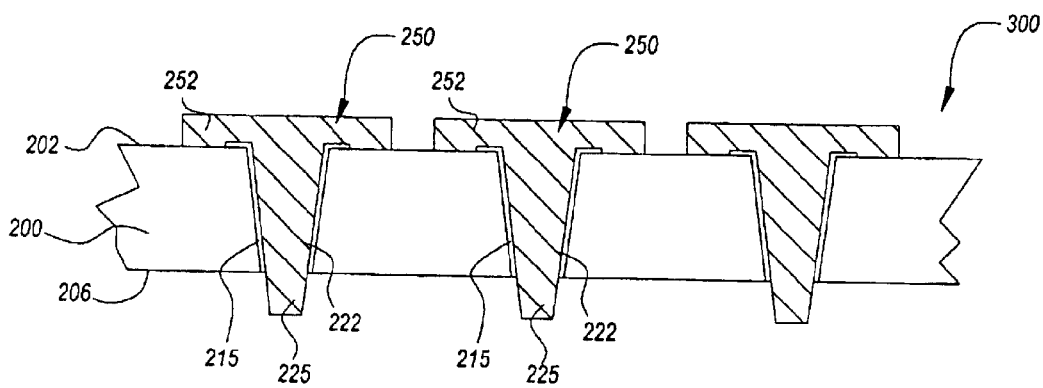

If the intermediate layer 212 is formed of a material with a suitably low adhesion to the conductor 222 and the urging member 252, it may be left in place in the probe card 300. The method 100 of FIG. 3, however, includes an optional procedure 145 in which the intermediate layer 212, including the peripheral rim 214, may be removed. As shown in FIG. 11, removing the intermediate layer 212 will leave a space 215 between the conductor 222 and the inner surface of the opening 210 (FIGS. 4–6) in the substrate 200. This space 215 will also extend between the urging member 252 and the back surface 202 of the substrate 200 where the peripheral rim 214 of the intermediate layer 212 was previously positioned.

The method 100 outlined in FIG. 3 also includes the optional procedure 150 of hardening the distal portions 225 of the conductors 222. This may be accomplished by coating the distal portions 225 with a hard or wear-resistant material, e.g., an electroless nickel or chrome plating layer (not shown). This may enhance durability if the conductors 226 are formed of a softer metal, e.g., aluminum or copper. Alternatively, the distal portions 225 of the conductors 222 may be coated with gold or the like to improve electrical connection of the conductors 222 to a microelectronic component contact 52 (FIG. 17). As is known in the art, the ability of the conductors 222 to penetrate any oxide layer on the contacts 52 can be enhanced by providing the distal portions 225 with an irregular surface, e.g., by shaping parallel "blades" or by adding dendritic particles or diamond particles.

Figure 12:
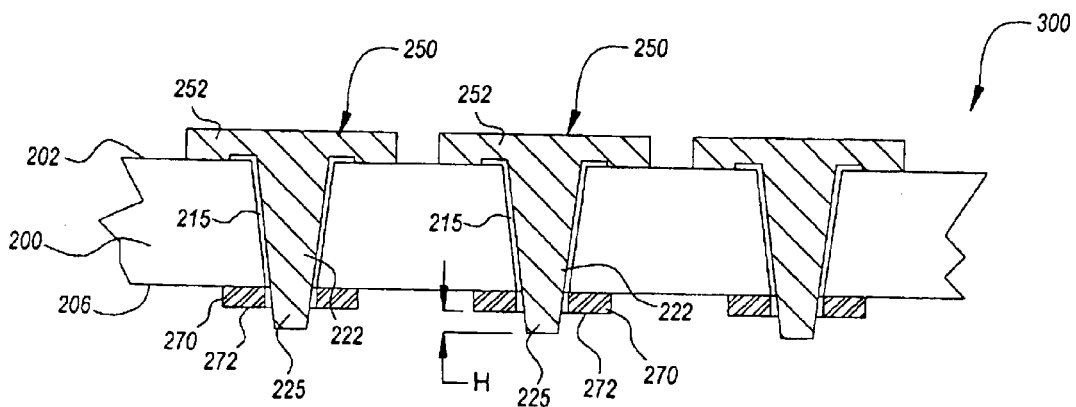

If so desired, one or more travel stops may be provided to limit travel of the connectors 222 during use in testing a microelectronic component 50 (FIG. 1). This is reflected in optional procedure 155 of the method 100 shown in FIG. 3. As illustrated in FIG. 12, the travel stop(s) may take the form of one or more abutments 270 carried on the etched surface 206 of the substrate 200. In one embodiment, a single planar abutment 270 may cover substantially the entire etched surface 206 of the substrate 200. In the particular implementation shown in FIG. 12, a series of separate abutments 270 are employed, with each abutment 270 comprising an annular ring centered about the distal portion 225 of one of the conductors 222. An abutting surface 272 of each of the abutments 270 may be spaced a travel height H inwardly from the distal end of the conductor distal portion 225. As explained below in connection with FIG. 17, this can substantially limit the travel of the connector 222 to this travel height H.

Figure 13:
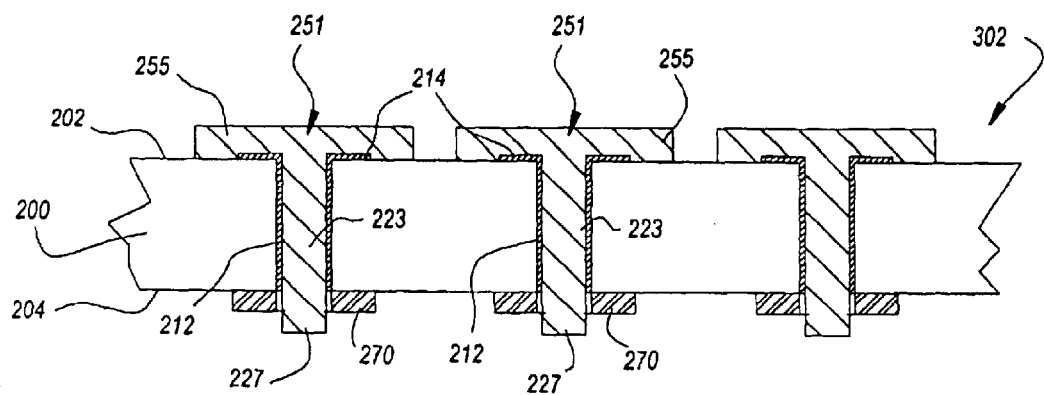
FIG. 13 is a schematic illustration, similar to FIG. 12, illustrating a microelectronic probe card in accordance with another embodiment of the invention.

FIG. 13 schematically illustrates a probe card 302 that is similar in many respects to the probe card 300 of FIG. 12 and like reference numbers are used in FIGS. 12 and 13 to indicate like elements. One difference between the probe cards 300 and 302 is that the conductors 223 in the probe card 302 have a substantially constant diameter (or other cross-sectional dimension) along their lengths instead of tapering outwardly in a rearward direction like the conductors 222 shown in FIG. 12. In addition, the probe card 302 of FIG. 13 retains the intermediate layer 212 between the conductor 223 and the substrate 200 instead of having it removed in procedure 145 (FIG. 3). The urging members 255 of the probes 251 in FIG. 13 may be directly analogous to the urging members 252 and 252a–c shown in FIGS. 8–9D.

In some embodiments, the size of the substrate 200 is selected to correspond to the dimensions of the desired probe card 20 (FIG. 1). In another embodiment, a number of probe cards 20 may be produced simultaneously on a single larger substrate 200. After the procedures 115–155 of the method 100, the large substrate 200 may be cut or "singulated" into a number of separate probe cards (procedure 160). If the substrate 200 comprises a semiconductor wafer, for example, this may be accomplished by dicing the remaining thickness R of the substrate with a wafer saw, as is known in the art.

In one embodiment, the probe card 300 shown in FIG. 12 may be electrically coupled to a controller 30 and used in the test system 10 to test microelectronic components 50. In such an embodiment, the remaining thickness R of the substrate should be strong enough to avoid buckling and deformation of the probe card 300 during a test operation. This will help ensure that the array of contacts 222 remains aligned with a corresponding array of contacts 52 on the microelectronic component 50. If so desired, a backing member (not shown) may be attached to the back surface 202 of the substrate. Such a backing member may add dimensional stability to the probe card 300. The backing member may also include circuitry to connect the contact pads 260 to the controller 30 of a microelectronic component test system 10 (FIG. 1).

As explained below in connection with FIG. 17, the urging members 252 of the probe card 300 shown in FIG. 12 allow the probes 250 to accommodate variations in the planarity of a microelectronic component 50 under test. The probe card 300 of FIG. 12 is thus compliant on one side, i.e., the side where the distal portions of 225 of the conductors 222 are exposed. The comparatively rigid contact pads 260 (FIG. 9A) on the back of the probe card 300 provide little compliance on the back surface of the probe card 300.

Figure 14:
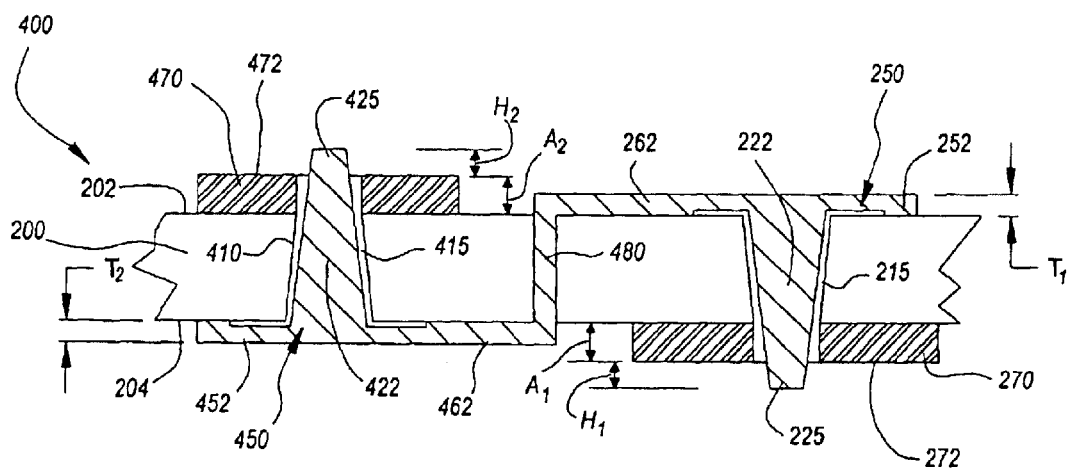
FIG. 14 is a schematic cross-sectional view illustrating a microelectronic probe card in accordance with an alternative embodiment of the invention.
Figure 15:
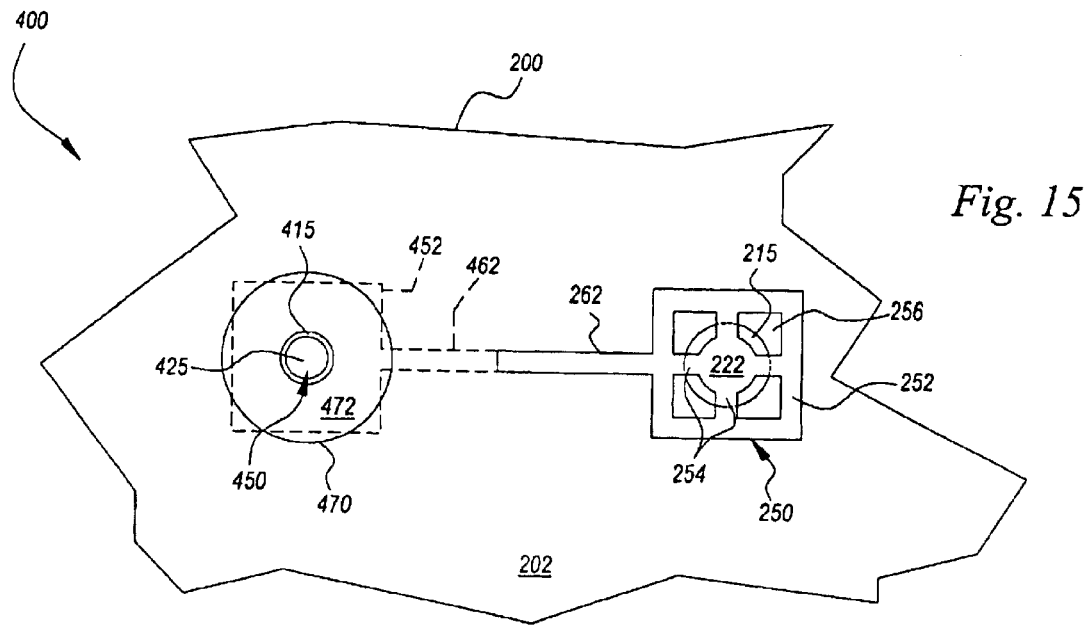
FIG. 15 is a schematic back elevation view of the microelectronic probe card of FIG. 14.

FIGS. 13–15 schematically illustrate a probe card 400 in accordance with an alternative embodiment of the invention. This probe card 400 is compliant on both sides, further enhancing the ability of the probe card 400 to accommodate variations in planarity of the microelectronic component 50 under test or other components of the microelectronic component test system 10 or 12 (FIGS. 1 and 2).

Figure 16:
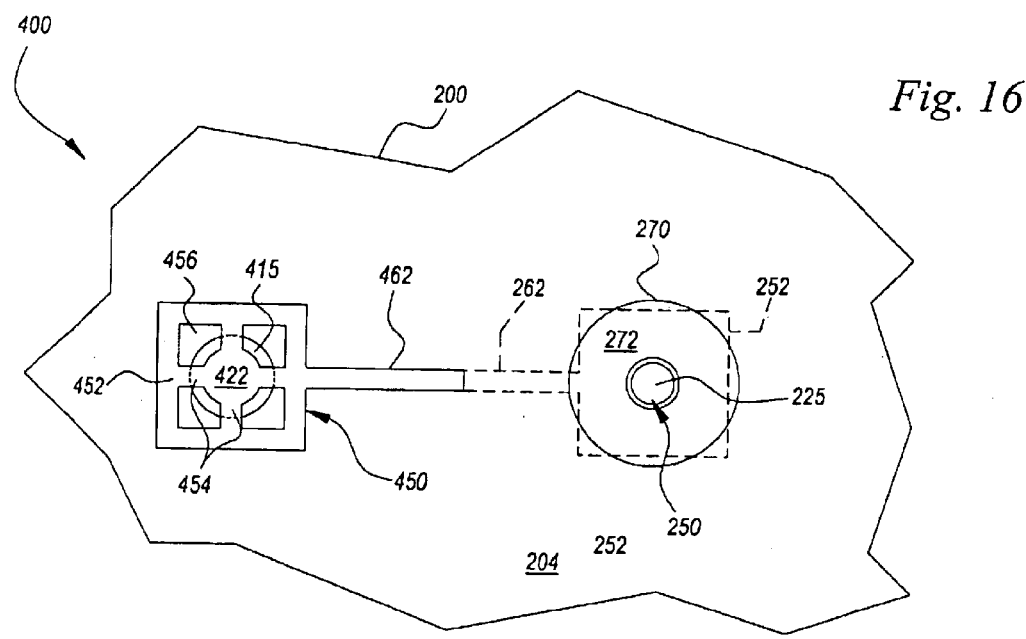
FIG. 16 is a schematic front elevation view of the microelectronic probe card of FIG. 14.
Figure 18:
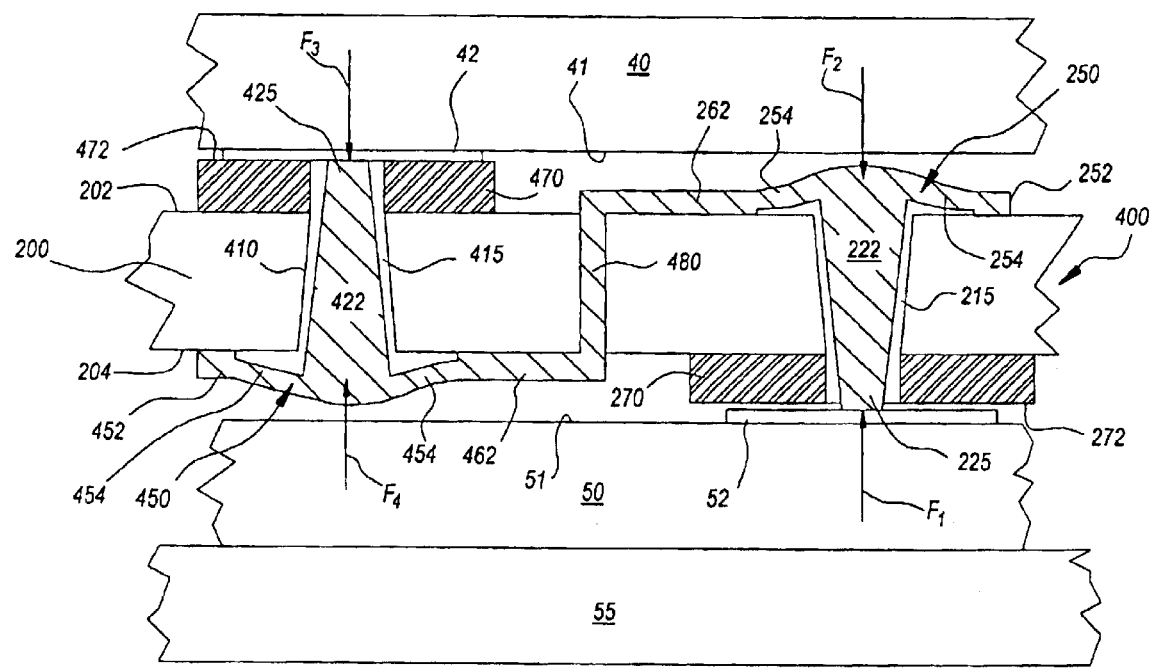
FIG. 18 is a schematic cross-sectional view depicting the probe card of FIG. 14 in use in accordance with still another embodiment of the invention.

The probe card 400 of FIGS. 14–16 generally includes an array of component probes 250 and an array of head probes 450. The component probes 250 are adapted to electrically contact microelectronic component contacts 52 (FIG. 18), whereas the head probes 450 are adapted to electrically contact test head contacts 44 (FIG. 18). A number of the elements of the probe card 400 are similar to elements of the probe card 300 discussed above and like reference numbers are used in FIGS. 4–12 and 14–16 to indicate functionally similar structures. Hence, the component probes 250 may be similar to the probes 250 illustrated in FIG. 12, for example. If so desired, the abutments 270 of the probe card 400 may cover a greater surface area of the etched surface 206 of the substrate 200 than do the abutments 270 shown in FIG. 12.

The head probes 450 may be similar in many respects to the contact probes 250. In the illustrated embodiment, the head probes 450 include a conductor 422 and a urging member 452. The conductor 422 generally includes a proximal portion that is joined to the urging member 452, an intermediate length that is slidably received in a second opening 410 through the substrate 200, and a distal portion 425 that extends outwardly beyond the back surface 202 of the substrate 200. A generally annular second abutment 470 may be carried on the back surface 202 of the substrate and centered about the conductor 422. The second abutment 470 may include an abutting surface 472 space outwardly from the back surface 202 of the substrate 200 by an abutment thickness $A_2$. This abutment thickness $A_2$ may be substantially the same as the abutment thickness $A_1$ of the abutment 270 associated with the component probe 250. In other embodiments, the abutment heights $A_1$ and $A_2$ of the abutments 270 and 470, respectively, may be different from one another. In the illustrated embodiment, the abutment thickness $A_1$ of the first abutment 270 is at least as great as the thickness $T_2$ of the urging member 452 and lead line 462 associated with the head probe 450. Similarly, the abutment height $A_2$ of the second abutment 470 may be at least as great as the thickness $T_1$ of the urging member 252 and lead line 262 associated with the contact probe 250. As explained below in connection with FIG. 18, having abutments heights $A_1$ and $A_2$ greater than the height of the electrically connective traces carried on the same surface of the substrate 200 can limit the likelihood of an inadvertent electrical short during testing.

The lead line 262 associated with the component probe 250 may be electrically coupled to the lead line 462 associated with the head probe 450. In the embodiment shown schematically in FIG. 14, the lead lines 262 and 462 are electrically connected to one another by a conductive via 480 that extends directly from the first lead line 262 to the second lead line 462 through the thickness of the substrate 200. If so desired, the electrical connection between the lead lines 262 and 462 may comprise more complex electrical circuitry carried in the thickness of the substrate 200. For example, the lead lines 262 and 462 may each be electrically coupled to an intermediate plane (not shown) of the substrate 200 that includes electrical traces to route signals from the lead line 262 to the lead line 462.

As shown in FIG. 14, the distal portion 225 of the component probe conductor 222 may extend a height $H_1$ outwardly beyond the abutting surface 272 of the first abutment 270. This positions the distal tip of the conductor 222 a height outwardly beyond the front surface 204 of the substrate 200 that is greater than the thickness $T_2$ of the urging member 452 and lead line 462 associated with the head probe 450. Similarly, the distal portion 425 of the head probe conductor 422 may extend a height $H_2$ outwardly beyond the abutting surface 472 of the second abutment 470. This positions the distal tip of the conductor 422 outwardly from the back surface 202 of the substrate 200 a distance that is greater than the thickness $T_1$ of the urging member 252 and lead line 262 associated with the contact probe 250.

The urging members 252 and 452 of the probe card 400 are illustrated in FIGS. 15 and 16. FIG. 15 is a back elevation view of the probe card 400, looking directly at the back surface 202 of the substrate 200. The urging member 252 shown in FIG. 15 may be substantially the same as the urging member 252 shown in FIG. 9A. In alternative embodiments, the urging member 252 may instead have a shape similar to one of the shapes illustrated in FIGS. 9B–D or any other suitable shape.

The urging member 452 of the head probe 450 is more readily visible in the front view of FIG. 16. This urging member 452 may be directly analogous to the urging member 252 shown in FIG. 15. Hence, the urging member 452 may be generally rectangular in shape and include a series of openings 456 that define a plurality of flexible arms 454 connected to the conductor 422. It should be recognized, though, that the urging member 452 is not limited to this particular shape and may instead take the form of one of the urging members shown in FIGS. 9B–D or any other suitable shape.

FIGS. 14–16 are isolation views that illustrate a single component probe 250 and a single head probe 450. It should be recognized, however, that the probe card 400 may include an array of component probes 450 arranged to correspond to an array of contacts 52 carried by a microelectronic component 50 (FIG. 1). Likewise, the probe card 400 may include an array of head probes 450. Some or all of the component probes 250 may be connected to one or more of the head probes 450. In one embodiment, the array of head probes 450 has a pitch that is greater than the array of component probes 250 and each of the head probes 450 is spaced from the component probe(s) 250 to which it is connected.

D. Microelectronic Component Testing

In one embodiment, the probe card 300 may be used as a probe card 20 in a testing system 10 such as that shown in FIG. 1. The probe card 310 may be electrically connected to the controller 30 of the test system 10 by electrical circuitry in a backing member (noted above) or in any other conventional fashion. For example, the test system 10 may include a head (not shown) carrying a plurality of POGO PINS or the like, with one POGO PIN associated with each of the contact pads 260 (FIG. 9A) of the probe card 300. The array of probes 250 of the probe card 310 may be brought into temporary electrical contact with a mating array of contacts 52 carried by the microelectronic component 50. A test signal may be delivered to the microelectronic component 50 with at least one of the probes 250 of the probe card 300 and performance of the microelectronic component 50 may be monitored in a conventional fashion.

FIG. 17 schematically illustrates a portion of the probe card 300 of FIG. 12 used to test a microelectronic component 50. The microelectronic component 50 may be positioned in a test area on a component support 55. The microelectronic component 50 includes a plurality of component contacts 52 carried on a confronting surface 51.

The confronting surface 51 of the microelectronic component 50 may be juxtaposed with the front surface 206 of the probe card 300. The probe card 300 may be positioned such that some or all of the probes 250 are juxtaposed with one or more of the component contacts 52 of the microelectronic component 50. In one embodiment, the conductors 222 of the probe card 300 are arranged in an array that corresponds to the array of component contacts 52 on the microelectronic component confronting surface 51 so that each of the probes 250 is juxtaposed with one of the component contacts 52.

As illustrated in FIG. 12, each of the arms 254 has a resilient free length that overhangs the space 215 formerly occupied by the peripheral rim 214 of the intermediate layer 212 (FIG. 10). The arms 254 urge the conductor 222 toward a default position wherein the distal portion 225 of the conductor 222 extends outwardly beyond the front surface 206 of the probe card 300. (In the context of FIG. 12, this distance would be the sum of the abutment thickness $A_1$ and the extension height $H_1$ of the distal portion 225 beyond the abutment 270.)

When the probe card 300 and microelectronic component 50 are first juxtaposed with one another, the front surface 206 of the probe card 300 will be spaced a first distance from the confronting surface 51 of the microelectronic component 50. When in this position, at least one of the conductors 222 of the probe card 300 may contact at least one of the component contacts 52. If the confronting surface 51 of the microelectronic component 50 is highly planar and the distal tips of the conductors 222 lie in a common plane, most or all of the conductors 222 may simultaneously contact the corresponding component contact 52.

With the front surface 206 of the probe card 300 juxtaposed with the confronting surface 51 of the microelectronic component 50, the distance between the front surface 206 and confronting surface 51 may be reduced, e.g., by moving the probe card 300 toward the component support 55. As the probe card 300 is moved toward the microelectronic component 50, the component contact 52 will exert a force $F_1$ (FIG. 17) against the distal portion 225 of the conductor 222. This force $F_1$ will tend to drive the conductor 222 rearwardly in the opening through the substrate 200, deflecting the resilient free lengths of the arms 254 of the probe 250. The arms 254 will exert a countervailing force $F_2$ tending to urge the conductor 222 forwardly against the surface of the component contact 52. This force $F_2$ is desirably sufficient to ensure a reliable electrical connection between the conductor 222 and the component contact 52.

In the embodiment of FIG. 17, the microelectronic component 50 has been moved toward the probe card 300 until the component contact 52 abuts the abutting surface 272 of the abutment 270 carried by the probe card 300. This will limit travel of the conductor 222 and avoid undue stress on the arms 254 of the conductive trace defining the urging member 252.

The travel height $H_1$ (FIG. 12) by which the distal portion 225 of the conductor 222 extends outwardly beyond the abutment 270 may be varied within a relatively wide functional range. In one embodiment, this travel height $H_1$ is no more than about 100 µm, e.g., about 30–50 µm. This is expected to accommodate the deviations in planarity of the confronting surfaces 51 of a variety of microelectronic components 50, ensuring that each of the conductors 222 will form a reliable electrical connection with a corresponding component contact 52 before movement of the probe card 300 with respect to the microelectronic component 50 is limited by one of the abutments 270 of the probe card 300 striking one of the component contacts 52.

Once the conductors 222 are in suitable electrical contact with the corresponding component contacts 52, the controller 30 of the microelectronic component test system (FIG. 1) may deliver a test signal from the power supply 36 (FIG. 1) to the microelectronic component 50 through one or more of the conductors 222. The performance of the microelectronic component 50 in response to the test signal may be monitored in a conventional fashion. Once the testing is completed, the distance between the probe card 300 and microelectronic component 50 may be increased again, lifting the conductors 222 away from the component contacts 52. The arms 254 of the urging members 252 will tend to return the conductors 222 toward their default positions (e.g., the positions shown in FIG. 12). The microelectronic component 50 may be removed from the test system 10 (FIG. 1) and the process may be repeated for the next microelectronic component 50.

FIG. 18 schematically illustrates the probe card 400 of FIGS. 14–16 used to test another microelectronic component 50. The behavior of the component probes 250 of the probe card 400 may be similar to the behavior of the probes 250 of the probe card 300, discussed above in connection with FIG. 17. The probe card 400 of FIG. 18, however, also includes an array of head probes 450 arranged to correspond to an array of head contacts 42 carried by the test head 40. These head probes 450 give the probe card 400 another degree of compliance not exhibited by the probe card 300 of FIG. 17.

In use, the front surface 204 of the probe card 400 may be juxtaposed with the confronting surface 51 of the microelectronic component 50 and the back surface 202 of the probe card 400 may be juxtaposed with the confronting surface 41 of the test head 40. Each of the component probes 250 may be juxtaposed with a corresponding one of the component contacts 52 and each of the head probes 450 may be juxtaposed with a corresponding one of the head contacts 42. The distance between the head 40 and the microelectronic component 50 may be reduced, e.g., by moving the head 40 toward the component support 55. This will exert a rearward force $F_2$ against the conductor 222 of each of the component probes 250 and a forward force $F_3$ against the conductor 422 of each of the head probes 450. The urging member 252 of each of the component probes 250 will exert a forward urging force $F_2$ against the associated conductor 222 and the urging member 452 of each of the test probes 450 will exert a rearward urging force $F_4$ against the corresponding conductor 422. These urging forces $F_2$ and $F_4$ will provide reliable electrical contact of the component probes 250 against the component contacts 52 and the head probes 450 against the head contacts 42. Because the probes 250 and 450 are electrically coupled by an electrical pathway 480, this provides a reliable electrical connection between each of the head contacts 42 of the test head 40 with a corresponding component contact 52 of the microelectronic component 50.

As suggested in FIG. 18, the probe card 400 may "float" somewhat between the test head 40 and the microelectronic component 50. In the particular configuration shown in FIG. 18, the back abutment 470 associated with the test probe 450 abuts against the head contact 42 of the test head. This will limit further travel of the test head 40 toward the back surface 202 of the substrate 200. The abutting surface 272 of the front abutment 270 of the probe card 400 is still spaced from the component contact 52 of the microelectronic component 50, though. This provides some additional resilience or freedom of movement between the test head 40 and the microelectronic component 50.

As shown in FIG. 18, the conductors 222 and 422 of the probes 250 and 450, respectively, may lift away from their default positions in response to the forces $F_1$ and $F_3$. By choosing appropriate abutment thicknesses $A_1$ and $A_2$ and conductor travel heights $H_1$ and $H_2$ (FIG. 14), a space may still be left between the component probes 250 and the confronting surface 41 of the test head 40 and between the head probes 450 and the confronting surface 51 of the microelectronic component 50. This can avoid any inadvertent electrical contact between the component probes 250 and the test head 40 and between the head probes 450 and the microelectronic component 50.

In one embodiment, the substrate 200 of the probe card 300 is formed of a material similar to the bulk of the microelectronic component 50. In one specific example useful for burn-in testing of silicon-based semiconductor wafers, dies, or packages, the substrate 200 of the probe card 300 is formed of silicon, e.g., from a wafer of undoped silicon. Since the body of the microelectronic component 50 and the substrate 200 of the probe card 300 are both formed of silicon, their coefficients of thermal expansion will be fairly closely matched. As a consequence, the probe card 300 can compensate for temperature variations over a relatively large range of test temperatures.

The above-detailed embodiments of the invention are not intended to be exhaustive or to limit the invention to the precise form disclosed above. Specific embodiments of, and examples for, the invention are described above for illustrative purposes, but those skilled in the relevant art will recognize that various equivalent modifications are possible within the scope of the invention. For example, whereas procedures are presented in a given order, alternative embodiments may perform procedures in a different order. The various embodiments described herein can be combined to provide further embodiments.

Unless the context clearly requires otherwise, throughout the description and the claims, the words "comprise," "comprising," and the like are to be construed in an inclusive sense as opposed to an exclusive or exhaustive sense, i.e., in a sense of "including, but not limited to." Use of the word "or" in the claims in reference to a list of items is intended to cover a) any of the items in the list, b) all of the items in the list, and c) any combination of the items in the list.

In general, the terms used in the following claims should not be construed to limit the invention to the specific embodiments disclosed in the specification unless the above-detailed description explicitly defines such terms. While certain aspects of the invention are presented below in certain claim forms, the inventors contemplate various aspects of the invention in any number of claim forms. Accordingly, the inventors reserve the right to add additional claims after filing the application to pursue such additional claim forms for other aspects of the invention.

I claim:

1. A probe card of the type used for microelectronic component testing, comprising:

a substrate having a first surface, a second surface, and a plurality of openings extending from the first surface to the second surface in an array, the plurality of openings including a first opening and a second opening;

a first conductor having a proximal portion adjacent the second surface of the substrate, an intermediate length slidably received in the first opening, and a distal portion extending beyond the first surface of the substrate;

a second conductor having a proximal portion adjacent the second surface of the substrate, an intermediate length slidably received in the second opening, and a distal portion extending beyond the first surface of the substrate; and first and second electrically conductive urging members carried by the second surface of the substrate, the first urging member being attached and electrically coupled to the proximal portion of the first conductor and urging the first conductor toward the first surface, and the second urging member being attached and electrically coupled to the proximal portion of the second conductor and urging the second conductor toward the first surface.

2. The probe card of claim 1 further comprising an adhesion-limiting intermediate layer carried on an inner surface of each of the first and second openings.

3. The probe card of claim 2 wherein the intermediate layers on the first and second openings are patterned from a common material.

4. The probe card of claim 2 wherein each of the intermediate layers comprise a dielectric material having greater adhesion to the substrate than to the conductor received in the same opening.

5. The probe card of claim 1 wherein the first and second urging members are patterned from a common conductive layer.

6. The probe card of claim 1 wherein the first and second conductors and the first and second urging members all comprise the same electrochemically deposited metal.

7. The probe card of claim 1 wherein each of the first and second openings has a maximum diameter of no greater than about 50 $\mu$m.

8. The probe card of claim 1 wherein each of the first and second openings has a substantially constant diameter.

9. The probe card of claim 1 wherein each of the first and second openings tapers outwardly in a direction from the first surface toward the second surface.

10. The probe card of claim 1 wherein each of the first and second openings has a first lateral dimension adjacent the first surface of the substrate and a second lateral dimension adjacent the second surface of the substrate, the second lateral dimension being greater than the first lateral dimension.

11. The probe card of claim 1 wherein the array of openings has an array pitch, further comprising a plurality of electrical contacts adjacent the second surface of the substrate arranged in a contact array that has a pitch greater than the array pitch, a first one of the electrical contacts being electrically coupled to the first urging member and a second one of the electrical contacts being electrically coupled to the second urging member.

12. The probe card of claim 1 further comprising an abutment carried by the first surface of the substrate and adapted to limit travel of the first conductor with respect to the first opening.

13. The probe card of claim 1 wherein the array of openings comprises a first array, further comprising a plurality of contact openings extending from the first surface to the second surface in a second array, a first one of the contact openings slidably receiving a first contact member that is electrically coupled to the first conductor and a second one of the contact openings slidably receiving a second contact member that is electrically coupled to the second conductor.

14. The probe card of claim 13 further comprising a third urging member and a fourth urging member, the third urging member being attached to the first contact member and electrically coupled to the first contact member and to the first conductor, the fourth urging member being attached to the second contact member and electrically coupled to the second contact member and to the second conductor.

15. The probe card of claim 13 wherein the first surface of the substrate also carries a third urging member, a fourth urging member, and an abutment, the third urging member being attached to the first contact member and electrically coupled to the first contact member and to the first conductor, the fourth urging member being attached to the second contact member and electrically coupled to the second contact member and to the second conductor, the abutment being adapted to limit travel of the first conductor with respect to the first opening and having a thickness at least as great as a thickness of the third urging member and at least as great as a thickness of the fourth urging member.

16. A microelectronic component testing system, comprising:
   a substrate having a first surface, a second surface, and a plurality of openings extending from the first surface to the second surface in an array, the plurality of openings including a first opening and a second opening;
   a first conductor having a proximal portion adjacent the second surface of the substrate, an intermediate length slidably received in the first opening, and a distal end extending beyond the first surface of the substrate;
   a second conductor having a proximal portion adjacent the second surface of the substrate, an intermediate length slidably received in the second opening, and a distal end extending beyond the first surface of the substrate;
   first and second electrically conductive urging members carried by the second surface of the substrate, the first urging member being attached and electrically coupled to the proximal portion of the first conductor and urging the first conductor toward the first surface, and the second urging member being attached and electrically coupled to the proximal portion of the second conductor and urging the second conductor toward the first surface;
   a power supply; and
   a controller coupled to the first and second urging members and to the power supply, the controller being adapted to selectively control delivery of power from the power supply to the first and second conductors.

17. The microelectronic component testing system of claim 16 further comprising a support adapted to hold microelectronic component comprising a material having a first coefficient of thermal expansion, the substrate having a coefficient of thermal expansion approximately the same as the first coefficient of thermal expansion.

18. The probe card of claim 16 further comprising an adhesion-limiting intermediate layer carried on an inner surface of each of the first and second openings.

19. The probe card of claim 16 wherein the first and second urging members are patterned from a common conductive layer.

20. The probe card of claim 16 wherein the first and second conductors and the first and second urging members all comprise the same electrochemically deposited metal.

21. The probe card of claim 16 wherein each of the first and second openings has a maximum diameter of no greater than about 50 $\mu$m.

22. The probe card of claim 16 wherein each of the first and second openings has a substantially constant diameter.

23. The probe card of claim 16 wherein each of the first and second openings tapers outwardly in a direction from the first surface toward the second surface.

24. The probe card of claim 16 wherein each of the first and second openings has a first lateral dimension adjacent the first surface of the substrate and a second lateral dimension adjacent the second surface of the substrate, the second lateral dimension being greater than the first lateral dimension.

25. The probe card of claim 16 wherein the array of openings has an array pitch, further comprising a plurality of electrical contacts adjacent the second surface of the substrate arranged in a contact array that has a pitch greater than the array pitch, a first one of the electrical contacts being electrically coupled to the first urging member and a second one of the electrical contacts being electrically coupled to the second urging member.

26. The probe card of claim 16 further comprising an abutment carried by the first surface of the substrate and adapted to limit travel of the first conductor with respect to the first opening.

27. The probe card of claim 16 wherein the array of openings comprises a first array, further comprising a plurality of contact openings extending from the first surface to the second surface in a second array, a first one of the contact openings slidably receiving a first contact member that is electrically coupled to the first conductor and a second one of the contact openings slidably receiving a second contact member that is electrically coupled to the second conductor.

28. A probe card, comprising:
   a substrate having a front surface, a back surface, and a plurality of openings extending from the front surface to the back surface;
   a first probe adapted to temporarily electrically contact a microelectronic component for testing, the first probe including a first conductor and a first electrical trace, the first conductor being slidably received in one of the openings through the substrate, the first electrical trace having a resilient free length adapted to urge the first conductor toward a default position wherein a distal portion of the first conductor extends outwardly beyond the front surface of the substrate by a first distance;
   a second probe including a second conductor and a second electrical trace, the second conductor being slidably received in another one of the openings through the substrate, the second electrical trace having a resilient free length adapted to urge the second conductor toward a default position wherein a distal portion of the second conductor extends outwardly beyond the back surface of the substrate by a second distance;
   an electrical pathway through the substrate to electrically couple the first electrical trace to the second electrical trace.

29. The probe card of claim 28 wherein the first distance is greater than a thickness of the second electrical trace and the second distance is greater than a thickness of the first electrical trace.

30. The probe card of claim 28 wherein the first electrical trace is patterned from a metal layer on the back surface of the substrate.

31. The probe card of claim 28 wherein the first electrical trace is patterned from a metal layer on the back surface of the substrate and the second electrical trace is patterned from a metal layer on the front surface of the substrate.

32. The probe card of claim 28 wherein further comprising an adhesion-limiting intermediate layer carried on an inner surface of the first opening.

33. The probe card of claim 28 wherein each of the first and second conductors and each of the first and second urging members comprises an electrochemically deposited metal.

34. The probe card of claim 28 wherein first opening tapers outwardly in a direction from the front surface toward the back surface.

35. The probe card of claim 28 wherein first opening tapers outwardly in a direction from the front surface toward the back surface and the second opening tapers outwardly in a direction from the back surface toward the front surface.

36. The probe card of claim 28 further comprising an abutment carried by the front surface of the substrate and adapted to limit travel of the first conductor with respect to the first opening.

37. The probe card of claim 28 further comprising first and second abutments, the first abutment being carried by the front surface of the substrate and adapted to limit travel of the first conductor with respect to the first opening, the second abutment being carried by the back surface of the substrate and adapted to limit travel of the second conductor with respect to the second opening.

38. A method of manufacturing a probe card, comprising:
    depositing an intermediate layer on an inner surface of an opening through a substrate, the opening extending from a front surface to a back surface of the substrate;
    substantially filling the resultant opening with an electrically conductive material and depositing an overburden of the electrically conductive material on the back surface of the substrate, the electrically conductive material in the opening defining a conductor;
    removing a front thickness of the substrate adjacent the front surface, exposing a distal portion of the conductor; and
    patterning the overburden to define an electrically conductive urging member attached and electrically coupled to the conductor, the urging member urging the conductor toward a position wherein the distal portion of the conductor is exposed.

39. The method of claim 38 wherein filling the lined opening and depositing the overburden comprises electrochemically depositing the electrically conductive material.

40. The method of claim 38 wherein the intermediate layer has a greater adhesion to the substrate than to the conductor.

41. The method of claim 38 further comprising selectively removing the intermediate layer, leaving a space between the conductor and the inner surface of the opening.

42. The method of claim 38 wherein depositing the intermediate layer includes depositing a peripheral portion of the intermediate layer about a periphery of the opening on the back surface of the substrate.

43. The method of claim 38 wherein depositing the intermediate layer includes depositing a peripheral portion of the intermediate layer about a periphery of the opening on the back surface of the substrate and the overburden is deposited over the peripheral portion.

44. The method of claim 38 further comprising forming the opening through the substrate.

45. The method of claim 38 further comprising forming the opening through the substrate, the opening being tapered outwardly in a direction from the front surface toward the back surface.

46. The method of claim 38 wherein the substrate comprises a base comprising a first material and an overlayer comprising a different second material, the base carrying the overlayer and an outer surface of the overlayer defining the front surface of the substrate, and wherein removing the front thickness of the substrate comprises removing the overlayer.

47. The method of claim 46 further comprising forming a stop on the front surface of the substrate adjacent the distal portion of the conductor to limit movement of the conductor within the opening.

48. The method of claim 38 wherein removing the front thickness comprises etching the substrate.

49. The method of claim 38 wherein removing the front thickness of the substrate defines a recessed front surface of the substrate and the first urging member urges the first conductor toward a position wherein the distal portion of the first conductor extends beyond the recessed front surface of the substrate.

50. The method of claim 38 wherein the opening is a first opening, the electrically conductive material is a first electrically conductive material, the conductor is a first conductor, and the urging member is a first urging member, the method further comprising:
    filling the second opening with a second electrically conductive material, the second electrically conductive material in the opening defining a second conductor;
    exposing a distal portion of the second conductor; and
    defining an electrically conductive second urging member attached and electrically coupled to the conductor, the second urging member urging the second conductor toward a position wherein the distal portion of the conductor is exposed.

51. The method of clam 50 wherein removing the front thickness of the substrate defines a recessed front surface of the substrate and the first urging member urges the first conductor toward a position wherein the distal portion of the first conductor extends beyond the recessed front surface of the substrate, the second urging member urging the second conductor toward the back surface of the substrate.

52. A method of testing a microelectronic component, comprising:
    positioning a microelectronic component in a test area, the microelectronic component including an array of component contacts, including a first component contact and a second component contact, on a confronting surface;
    juxtaposing the confronting surface of the microelectronic component with a front surface of a probe card, the probe card including a plurality of probes arranged in a probe array, the plurality of probes including a first probe juxtaposed with the first component contact and a second probe juxtaposed with the second component contact, the first probe comprising a first conductor slidably received in a first opening in the substrate and an electrically conductive first trace carried by a back surface of the substrate, the first conductor and the first trace being integrally formed of a conductive material, the second probe comprising a second conductor slidably received in a second opening in the substrate and an electrically conductive second trace carried by a back surface of the substrate, the second conductor and the second trace being integrally formed of the conductive material;

contacting the first component contact with the first conductor;

contacting the second component contact with the second conductor;

reducing a distance between the confronting surface of the microelectronic component and the front surface of the probe card, the first component contact forcing the first conductor to slide in the first opening in a direction toward the back surface of the substrate and to deform the first trace, the first trace urging the first conductor toward the first component contact, and the second component contact forcing the second conductor to slide in the second opening in a direction toward the back surface of the substrate and to deform the second trace, the second trace urging the second conductor toward the second component contact; and delivering a test signal to the microelectronic component, the test signal being carried by the first trace to the first conductor and by the first conductor to the first component contact.

53. The method of claim 52 further comprising, after delivering the test signal, increasing the distance between the confronting surface of the microelectronic component and the front surface of the substrate, the first trace forcing the first conductor to slide in the first opening in a direction toward the front surface of the substrate and the second trace forcing the second conductor to slide in the second opening in a direction toward the front surface of the substrate.

* * * * *